US008728718B2

(12) United States Patent
Horiuchi et al.

(10) Patent No.: US 8,728,718 B2
(45) Date of Patent: May 20, 2014

(54) METHOD FOR MANUFACTURING LIQUID EJECTION HEAD

(71) Applicant: Canon Kabushiki Kaisha, Tokyo (JP)

(72) Inventors: Isamu Horiuchi, Yokohama (JP); Hiroaki Mihara, Machida (JP); Kazunari Ishizuka, Suntou-gun (JP); Ken Ikegame, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/898,221

(22) Filed: May 20, 2013

(65) Prior Publication Data

US 2013/0323650 A1 Dec. 5, 2013

(30) Foreign Application Priority Data

May 31, 2012 (JP) ................................ 2012-124836

(51) Int. Cl.
*B41J 2/16* (2006.01)
*G03F 7/20* (2006.01)

(52) U.S. Cl.
USPC .......................................................... 430/320

(58) Field of Classification Search
None
See application file for complete search history.

(56) References Cited

U.S. PATENT DOCUMENTS

| | | | | |
|---|---|---|---|---|
| 2006/0172227 | A1 * | 8/2006 | Shaarawi et al. | 430/311 |
| 2012/0047736 | A1 * | 3/2012 | Horiuchi | 29/890.1 |
| 2013/0266901 | A1 * | 10/2013 | Ikegame et al. | 430/320 |

FOREIGN PATENT DOCUMENTS

JP 4498363 B2 7/2010

* cited by examiner

*Primary Examiner* — John A. McPherson
(74) *Attorney, Agent, or Firm* — Canon USA Inc. IP Division

(57) ABSTRACT

There is provided a method for manufacturing a liquid ejection head having a substrate and a channel-forming member having an ejection port from which a liquid is ejected, the method including forming a negative photosensitive resin layer on or above the substrate; forming a lens layer on the negative photosensitive resin layer, the lens layer having a lens; exposing the negative photosensitive resin layer through the lens to form an ejection port in the negative photosensitive resin layer; and removing the lens layer.

16 Claims, 15 Drawing Sheets

METHOD FOR MANUFACTURING LIQUID EJECTION HEAD

BACKGROUND OF THE INVENTION

1. Field of the Invention

The present invention relates to a method for manufacturing a liquid ejection head.

2. Description of the Related Art

Liquid ejection apparatuses are known as apparatuses in which a liquid is ejected from an ejection port onto a recording medium to record images. In liquid ejection apparatuses, an ejection port is formed in a liquid ejection head. Such an ejection port is formed by, for example, conducting exposure and development of a photosensitive resin layer disposed on or above a substrate.

In recent years, there has been a demand for recording of high-resolution images, which has lead to a need to decrease the size of liquid droplets to be ejected. The size of liquid droplets to be ejected may be decreased by reducing the diameter of an ejection port; however, simply reducing the diameter of an ejection port increases the fluid resistance of liquid droplets during ejection thereof. A problem such as a decreased ejection rate of liquid droplets therefore occurs in some cases.

An ejection port having a so-called tapered shape is known as an ejection port used for overcoming such a problem, in which the cross-sectional area of the ejection port decreases as it extends from the substrate side toward a surface in which the ejection port opens. In a method disclosed in Japanese Patent No. 4498363, a recess is formed in a surface of a photosensitive resin layer (side that serves as a surface in which the ejection port opens), and a tapered ejection port is formed at the bottom of the recess by photolithography. In this method, the recess functions as a concave lens in an exposure process, and light can be refracted by the concave lens to form an ejection port into a tapered shape.

SUMMARY OF THE INVENTION

The present invention provides a method for manufacturing a liquid ejection head having a substrate and a channel-forming member having an ejection port from which a liquid is ejected, the method including the steps of: (a) forming a negative photosensitive resin layer on or above the substrate; (b) forming a lens layer on the negative photosensitive resin layer, the lens layer having a lens; (c) exposing the negative photosensitive resin layer through the lens to form an ejection port in the negative photosensitive resin layer; and (d) removing the lens layer.

Further features of the present invention will become apparent from the following description of exemplary embodiments with reference to the attached drawings.

DESCRIPTION OF THE EMBODIMENTS

In the case where a liquid ejection apparatus including a member having a surface in which an ejection port opens continuously ejects liquid, the liquid may adhere onto this surface. In particular, a liquid adhering to part of such a surface near the opening of an ejection port may disturb ejection of liquid in an intended direction; thus, liquid does not always land on a target position in some cases. Accordingly, a liquid adhering onto a surface in which an ejection port opens has been wiped off with a blade formed of, for instance, rubber.

In the method disclosed in Japanese Patent No. 4498363, however, an ejection port is formed at the bottom of a recess. Hence, the blade does not sufficiently enter the recess and may not sufficiently wipe off a liquid adhering to part of a surface in which the ejection port opens, the part being near the opening of the ejection port.

The present invention therefore enables manufacturing of a liquid ejection head which has an ejection port having a tapered shape and in which a liquid adhering to part of a surface in which the ejection port opens can be sufficiently wiped off with a blade, the part being near the opening of the ejection port.

Figure 1A:
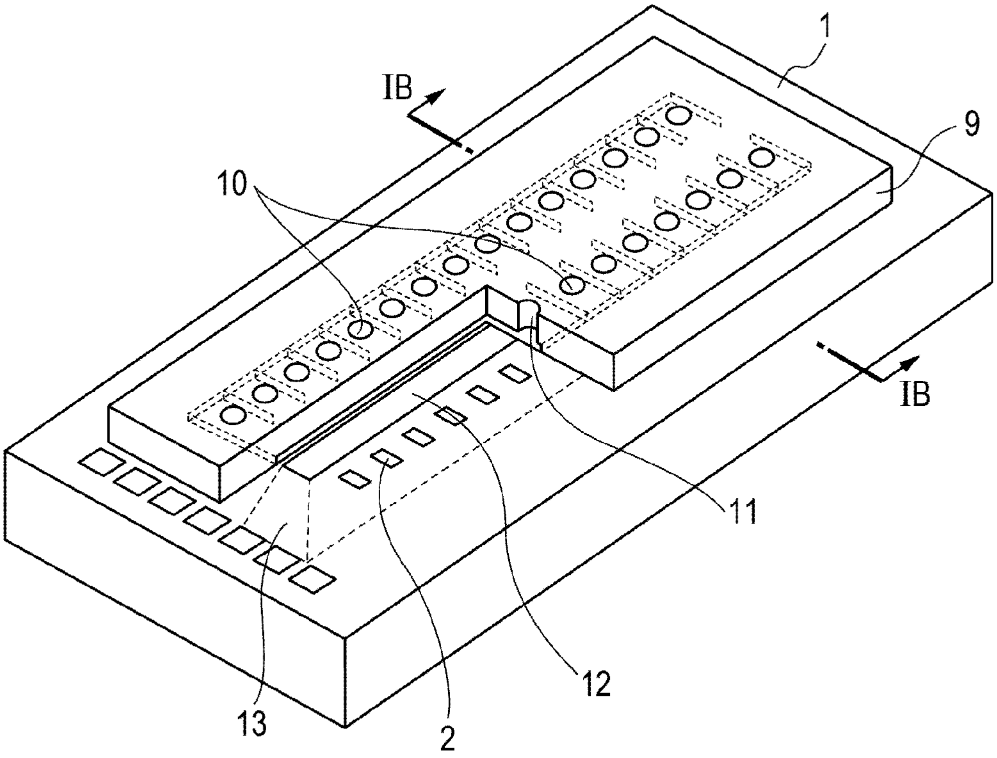
FIGS. 1A and 1B schematically illustrate a liquid ejection head.
Figure 1B:
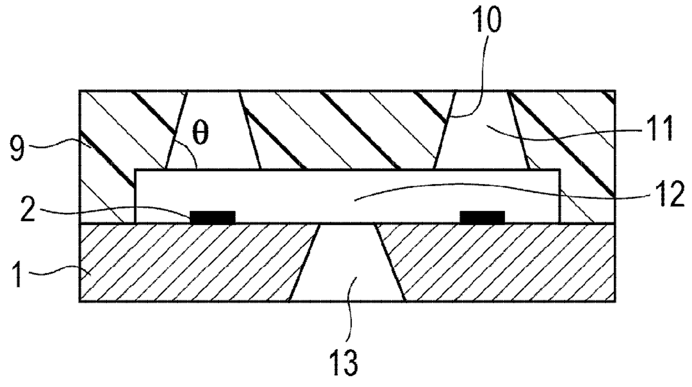

A liquid ejection head to be manufactured in the present invention will now be described with reference to the drawings. FIG. 1A schematically illustrates a liquid ejection head. FIG. 1B is a schematic cross-sectional view illustrating the liquid ejection head taken along the line IB-IB in FIG. 1A in a direction perpendicular to a substrate.

In the liquid ejection head illustrated in FIG. 1A, energy-generating devices 2 that generate energy used for ejecting a liquid, such as ink, are formed on a substrate 1 at predetermined intervals. Each energy-generating device 2 may be directly formed on the substrate 1 or may be formed such that an insulating layer or another member is interposed between the substrate 1 and the energy-generating device 2. Each energy-generating device 2 may be formed so as to have a hollow structure in which a space is formed between the substrate 1 and the energy-generating device 2. Each energy-generating device 2 may be a heating device (heater) formed of, for instance, TaSiN or may be a piezoelectric device. The substrate 1 is formed of silicon or another material, and a supply port 13 through which a liquid is supplied is formed between two lines in which the energy-generating devices 2 are arrayed. A channel-forming member 9 is formed on or above the substrate 1, has ejection ports 11 formed therein, and defines a liquid channel 12. Each ejection port 11 is positioned so as to correspond to the energy-generating device 2 and has an opening 10 formed in the upper surface of the channel-forming member 9. In the present invention, the surface of the channel-forming member 9 in which each opening 10 has been formed is defined as an ejection port-opening surface.

In the liquid ejection head illustrated in FIG. 1A, a pressure generated by each energy-generating device 2 is applied to a liquid supplied from the supply port 13 through the liquid channel 12, thereby ejecting droplets of the liquid from the opening 10 of each ejection port 11. Such a liquid ejection head is referred to as an ink jet recording head in the case where the liquid is ink.

As illustrated in FIG. 1B, each ejection port 11 of the liquid ejection head has a shape in which the cross-sectional area of the liquid ejection port 11 in a direction parallel to the surface of the substrate 1 decreases as the liquid ejection port 11 extends from the liquid channel 12 toward the ejection port 11-opening surface (surface in which the opening 10 has been formed). Such a shape is referred to as a tapered shape. The taper angle of each ejection port 11 (angle defined by the inner wall of an ejection port 11 and the surface of the substrate 1, represented by the symbol "θ" in FIG. 1B) is preferably not less than 50°, more preferably not less than 60°, and further preferably not less than 70°. The taper angle may be not more than 85°. The liquid ejection head to be manufactured in the present invention can have a flat ejection port 11-opening surface as illustrated in FIGS. 1A and 1B.

In the liquid ejection head, all of the ejection ports 11 do not necessarily have the same tapered shape. For example, a taper angle may be changed on the basis of the ejection characteristics of a liquid to be ejected from an ejection port, or an ejection port having a straight shape (namely, θ=90°) instead of a tapered shape may be provided.

A method for manufacturing a liquid ejection head of the present invention will now be described with reference to the drawings.

First Embodiment

FIGS. 2A to 2H illustrate a method for manufacturing a liquid ejection head of the first embodiment. FIGS. 2A to 2H are schematic cross-sectional views taken along the same line as in FIG. 1B.

Figure 2A:
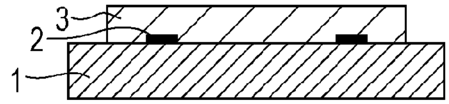
FIGS. 2A to 2H illustrate an embodiment of a method for manufacturing a liquid ejection head.

As illustrated in FIG. 2A, the substrate 1 having the energy-generating devices 2 is prepared, and a pattern 3 that is a mold for the liquid channel 12 is formed on the surface of the substrate 1. The pattern 3 may be formed of a positive photosensitive resin which becomes soluble in a developer by being irradiated with light. Examples of the usable positive photosensitive resin include vinyl ketones, such as polymethyl isopropenyl ketone and polyvinyl ketone, and photodegradable acrylic polymeric compounds. Examples of photodegradable acrylic polymeric compounds include copolymers of methacrylic acid and methyl methacrylate and copolymers of methacrylic acid, methyl methacrylate, and methacrylic anhydride. The thickness of the pattern 3 is not specifically limited and may be in the range of 3.0 to 50.0 μm.

Figure 2B:
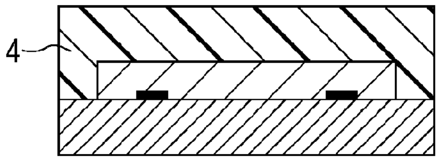

Then, as illustrated in FIG. 2B, a negative photosensitive resin layer 4 is formed so as to cover the pattern 3. The negative photosensitive resin layer 4 will be cured into the channel-forming member 9 later. The negative photosensitive resin layer 4 may exhibit high resolution which enables proper photolithographic patterning. The negative photosensitive resin layer 4 after being cured may exhibit good mechanical strength, resistance to a liquid (ink), and adhesion to a base such as substrate. From these standpoints, the negative photosensitive resin layer 4 may be formed of a cationically polymerizable epoxy resin composition. In particular, cationically photopolymerizable epoxy resin compositions each containing an epoxy resin as a primary component (e.g., bisphenol A epoxy resin, phenol novolac epoxy resin, cresol novolac epoxy resin, or multifunctional epoxy resin having an oxycyclohexane skeleton) and a photopolymerization initiator may be used. These epoxy resins have two or more functional epoxy groups and can be therefore three-dimensionally cross-linked for curing; thus, such epoxy resins can be suitably used to satisfy the above-mentioned requirements. Specific examples of such epoxy resins include Celloxide 2021, the GT-300 series, the GT-400 series, and EHPE3150 (trade names, manufactured by DAICEL CORPORATION); 157S70 (trade name, manufactured by Japan Epoxy Resin); and EPICLON N-865 (trade name, manufactured by DIC Corporation). Examples of a photopolymerization initiator include sulfonic acid compounds, diazomethane compounds, sulfonium salt compounds, iodonium salt compounds, and disulfone compounds. Specific examples thereof include ADEKA OPTOMER SP-170, ADEKA OPTOMER SP-172, and SP-150 (trade names, manufactured by ADEKA CORPORATION); BBI-103 and BBI-102 (trade names, manufactured by Midori Kagaku Co., Ltd.); and IBPF, IBCF, TS-01, and TS-91 (trade names, manufactured by SANWA Chemical Co., Ltd). The epoxy resin composition may contain a basic substance such as amines, a photosensitizing compound such as anthracene derivatives, and a silane coupling agent to further enhance photolithographic properties and adhesion to the substrate.

In addition, the SU-8 series and KMPR-1000 (trade names, manufactured by Kayaku MicroChem Corporation) and TMMR S2000 and TMMF S2000 (trade names, manufactured by TOKYO OHKA KOGYO CO., LTD.) may be used for the negative photosensitive resin layer 4.

In order to form the negative photosensitive resin layer 4, a coating liquid containing the above-mentioned composition is applied onto the substrate 1 by spin coating, roll coating, or slit coating so as to cover the pattern 3. Alternatively, a dry film of the above-mentioned composition may be disposed on or above the substrate 1 so as to cover the pattern 3. The negative photosensitive resin layer 4 can have any thickness. The thickness may be in the range of 5.0 to 100.0 μm from the surface of the substrate 1.

The surface of the negative photosensitive resin layer 4 eventually serves as the ejection port-opening surface. Hence, in order to impart water repellency or hydrophilic properties to the ejection port-opening surface, the surface of the negative photosensitive resin layer 4 may be subjected to a water-repellent treatment or hydrophilic treatment in the process illustrated in FIG. 2B. Alternatively, the negative photosensitive resin layer 4 may contain a fluorine-based compound that imparts water repellency.

Figure 2C:
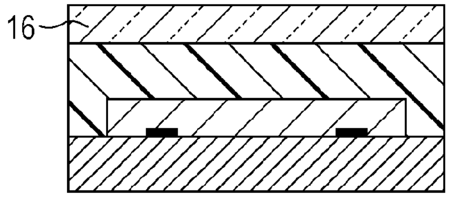

A lens layer 5 is subsequently formed on the negative photosensitive resin layer 4. In order to form the lens layer 5, a lens layer-forming material 16 is applied onto the negative photosensitive resin layer 4 as illustrated in FIG. 2C.

Figure 2D:
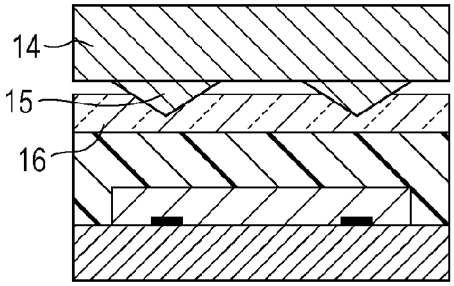
Figure 2E:
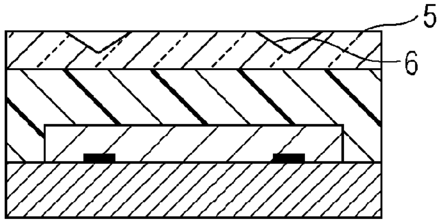

Then, as illustrated in FIG. 2D, the lens layer-forming material 16 is molded with a mold 14 (imprint method) to form lenses 6. In particular, the mold 14 has protrusion patterns 15 each having a shape of the lens 6 to be transferred and is pressed against the lens layer-forming material 16 at a mold temperature of 20 to 120° C. and a pressure of 0.01 to 5 MPa to transfer the shape of each protrusion pattern 15 to the lens layer-forming material 16. The protrusion patterns 15 are subsequently separated to complete the formation of the lens layer 5 having the lenses 6 (FIG. 2E). In view of the transfer, the lens layer-forming material 16 may contain a resin. In general imprint methods, a mold is heated to a temperature greater than or equal to the glass transition point of the resin to which a pattern is to be transferred, and the pattern is transferred at a pressure greater than 5 MPa. In the present invention, however, the pattern to be transferred has a small aspect ratio, and each lens 6 formed in the lens layer-forming material 16 need not have a large depth; thus, patterning can be carried out at relatively low temperature and pressure. The lens formed in the present invention is a concave lens as illustrated in FIG. 2E.

The mold 14 can be formed of a material exhibiting excellent strength and processability, such as metallic materials, glass, ceramic materials, silicon, quartz, plastic materials, and photosensitive resins. Each protrusion pattern 15 of the mold 14 may be also formed of the same material as used for the mold 14 and may be formed so as to be integrated with the mold 14. The shape of the protrusion patterns 15 corresponds to the shape of the lenses 6 to be formed. Each protrusion pattern 15 has at least an inclined surface which defines the taper angle of the ejection port 11 to be eventually formed. The inclined surface may be a curved surface. However, in view of pressing efficiency during transfer, the inclination of the inclined surface preferably remains constant. In other words, the protrusion pattern 15 may have the shape of a circular cone, an elliptic cone, or a pyramid.

The lens layer-forming material 16, namely, the lens layer 5 may contain a resin as described above. In particular, this resin may be a resin to which the protrusion patterns 15 of the mold 14 are smoothly transferred by an imprinting method and which sufficiently transmits light used for patterning the negative photosensitive resin layer 4 and is easily removable after curing of the negative photosensitive resin layer 4. The lens layer 5 may transmit not less than 50% of light used for patterning the negative photosensitive resin layer 4 (light transmittance of not less than 50%). Examples of such a resin include vinyl ketone-based polymeric compounds such as polymethyl isopropenyl ketone and polyvinyl ketone; positive resists soluble in organic solvents, such as copolymers of methacrylic acid and methyl methacrylate; positive resists such as polyvinyl alcohols and novolac resin-based resists; cyclized rubbers such as polyisoprene rubber; epoxy resins such as a bisphenol A epoxy resin, a phenol novolac epoxy resin, a cresol novolac epoxy resin, and a multifunctional epoxy resin having an oxycyclohexane skeleton; and alkylsiloxane-containing epoxy resins. In view of removability, positive photosensitive resins may be particularly used. In the case where the resin used for forming the lens layer 5 is a cationically polymerizable epoxy resin, the lens layer 5 contacting the negative photosensitive resin layer 4 is cured during the patterning of the negative photosensitive resin layer 4, which leads to formation of a thin film having a thickness of approximately not more than 2 μm in some cases. Such a thin film about 2 μm or less in thickness, however, does not significantly affect the performance of the liquid ejection head.

The lens layer-forming material 16 can be applied onto the negative photosensitive resin layer 4 by, for instance, spin coating, slit coating, or laminating. In forming the lens layer-forming material 16 on the negative photosensitive resin layer 4, the negative photosensitive resin layer 4 and the lens layer-forming material 16 may remain immiscible to each other. Accordingly, the lens layer-forming material 16 may be dissolved in a solvent, applied onto a film such as a polyethylene terephthalate (PET) film, and dried to form a dry film thereon, and the dry film may be laminated on the negative photosensitive resin layer 4 with a laminator.

In a direction perpendicular to the substrate 1, the thickness of the lens layer 5 may be at least 1.5 times and at most 5.0 times the depth of each lens 6 to be formed. The depth of each lens 6 in the direction perpendicular to the substrate 1 refers to the largest depth of the lens 6 in the direction perpendicular to the substrate 1; for example, if each lens 6 is in the form of a cone, it refers to the height of the cone, in other words, the length of the line segment between the center of the bottom of the cone and the apex thereof. Depending on the materials and formation processes of the negative photosensitive resin layer 4 and the lens layer 5, if the thickness of the lens layer 5 is less than 1.5 times the depth of each lens 6, the protrusion pattern is transferred even to the negative photosensitive resin layer 4 when the mold 14 is pressed, which may lead to formation of a recess in the ejection port-opening surface. If the thickness of the lens layer 5 is larger than 5.0 times the depth of each lens 6, the lens layer 5 may not be properly removed with the result that the remaining lens layer 5 may give unevenness to the ejection port-opening surface.

Figure 2F:
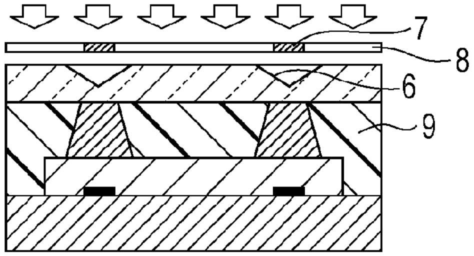

After formation of the lens layer 5 having the lenses 6, as illustrated in FIG. 2F, the negative photosensitive resin layer 4 is exposed to a pattern of light through a photomask 8 and the lenses 6, the photomask 8 having a light-shielding pattern 7 covering regions to be formed into ejection ports. Then, the negative photosensitive resin layer 4 is heated (thermal treatment) to cure the exposed part of the negative photosensitive resin layer 4, thereby forming the channel-forming member 9. The photomask 8 includes a substrate which can transmit light having an exposure wavelength and which is formed of, for example, glass or quartz and the light-shielding pattern 7, such as a chromium film, formed thereon. Examples of an exposure apparatus used for the exposure include projection exposure apparatuses each having a single-wavelength light source, such as an i-line exposure stepper and a KrF stepper, and projection exposure apparatuses each having a broad-wavelength light source (e.g., a mercury lamp), such as a mask aligner (trade name: MPA-600Super, manufactured by CANON KABUSHIKI KAISHA). Furthermore, an optical filter which can transmit light of a desired wavelength may be used in combination.

In general, in the case where a negative photosensitive resin layer is patterned, the negative photosensitive resin layer shrinks on curing or heating due to thermal treatment after exposure to light, which results in a change in the shape of the pattern in some cases. In the present invention, since the lens layer 5 is formed on the negative photosensitive resin layer 4, such a change in the shape of the pattern can be reduced.

Figure 2G:
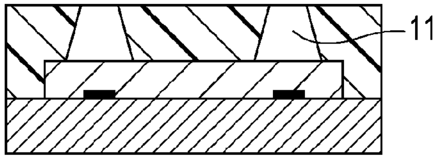
Figure 9A:
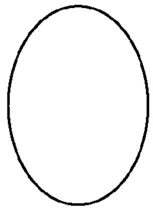
FIGS. 9A to 9C schematically illustrate an ejection port of a liquid ejection head.
Figure 9B:
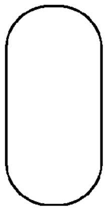
Figure 9C:
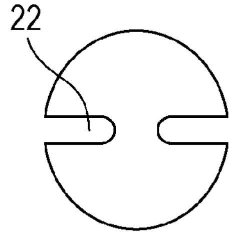

Then, as illustrated in FIG. 2G, the unexposed part of the negative photosensitive resin layer 4 (channel-forming member 9) and the lens layer 5 are removed to form the ejection ports 11. The unexposed part of the negative photosensitive resin layer 4 and the lens layer 5 may be simultaneously or separately removed. The lens layer 5 may be completely removed so as not to remain on the ejection port-opening surface. The opening of each ejection port 11 may have a circular shape or may have shapes, for instance, illustrated in FIGS. 9A to 9C in view of ejection characteristics or other characteristics. In particular, an ejection port having protrusions 22 inside as illustrated in FIG. 9C holds a liquid between the protrusions 22, which can greatly reduce incidence of division of liquid droplets (division into primary droplets and satellite droplets) during liquid ejection. The shape of the opening of each ejection port 11 can be determined by the shape of the light-shielding pattern 7 of the photomask 8.

Figure 2H:
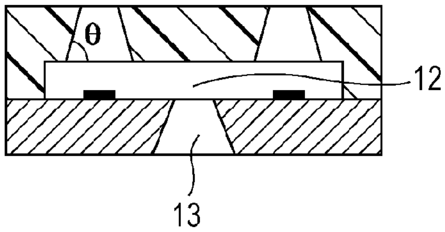

Then, as illustrated in FIG. 2H, the supply port 13 is formed in the substrate 1 with an alkaline etchant, and the pattern 3 is dissolved with a solvent and removed to form the liquid channel 12. In addition, thermal treatment is optionally carried out to further cure the channel-forming member 9, thereby completing the manufacturing of the liquid ejection head.

Figure 3A:
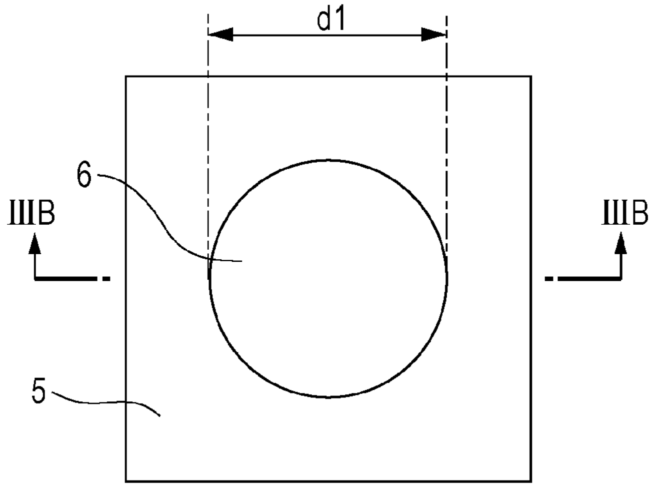
FIGS. 3A and 3B schematically illustrate a lens.
Figure 3B:
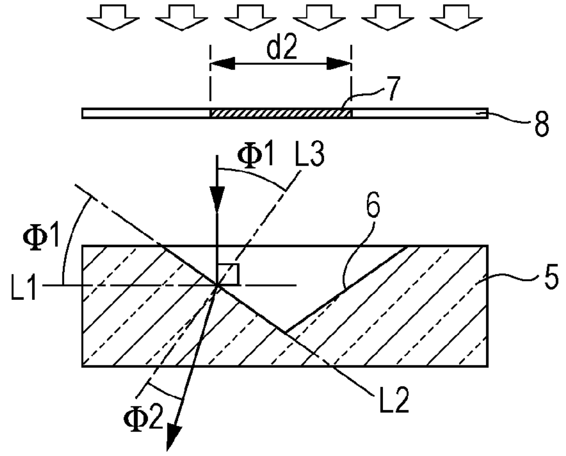

FIGS. 3A and 3B illustrate the lens 6 formed in the lens layer 5. FIG. 3A illustrates the lens 6 viewed from the top. The line IIIB-IIIB in FIG. 3A passes through the center of the lens 6. FIG. 3B is a cross-sectional view illustrating the lens 6 taken along the line IIIB-IIIB in FIG. 3A in a direction perpendicular to the substrate. Effects of the lens 6 will now be described with reference to FIG. 3B. The relationship between the diameter d1 of the lens 6 and the diameter d2 of the light-shielding pattern 7 (see FIG. 3A) is d1>d2. The incident light which has passed through the photomask 8 having the light-shielding pattern 7 is refracted by an inclined surface (L2) of the lens 6. In this case, the incident angle of the light which enters the inclined surface (L2) is an angle $\Phi 1$ defined by a line segment (L3) normal to the inclined surface (L2) and the optical path of the incident light. In this case, the angle defined by a line segment (L1) normal to the incident light and the inclined surface (L2) is equal to the angle $\Phi 1$ defined by the line segment (L3) normal to the inclined surface (L2) and the optical path of the incident light. In accordance with Snell's law, the refraction angle $\Phi 2$ of the optical path of light refracted by the inclined surface (L2) can be expressed as $n1 \sin \Phi 1 = n2 \sin \Phi 2$ where n1 represents the refractive index at the outside of the lens 6 and n2 represents the refractive index at the lens layer 5. In this case, n1 can be equal to 1 if the outside of the lens 6 is an air atmosphere, and n2 can be larger than 1 if the lens layer 5 is formed of, for example, a resin, which provides the relationship of $\Phi 2 < \Phi 1$. Accordingly, the portion shielded with the light-shielding pattern 7 becomes wider with the depth during exposure through the lens 6. In other words, the ejection port 11 formed in the negative photosensitive resin layer 4 comes to have a tapered shape.

In the first embodiment, each ejection port 11 of the produced liquid ejection head has a tapered shape. Furthermore, since the lens layer 5 is removed, the ejection port-opening surface can be made flat, and a liquid adhering to part of the ejection port-opening surface near the opening of each ejection port 11 can be smoothly wiped off with a blade.

Second Embodiment

The second embodiment is different from the first embodiment in that the formation of the lenses 6 is changed after the process illustrated in FIG. 2B.

Figure 4A:
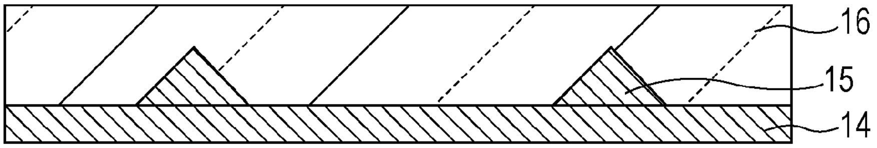
FIGS. 4A and 4B illustrate another embodiment of a method for manufacturing a liquid ejection head.
Figure 4B:
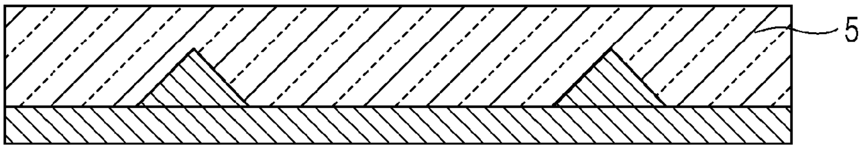

With reference to FIGS. 4A and 4B, the same mold 14 as used in the first embodiment is prepared. The mold 14 has the protrusion patterns 15, and the surfaces of the mold 14 and protrusion patterns 15 are subjected to a mold release treatment. A resin or another material is applied onto the surface of the mold 14 by spin coating to form the lens layer-forming material 16 (FIG. 4A). Then, the mold 14 is heated with, for example, a hot plate to remove a solvent contained in the lens layer-forming material 16 to form the lens layer 5 (FIG. 4B).

Figure 5A:
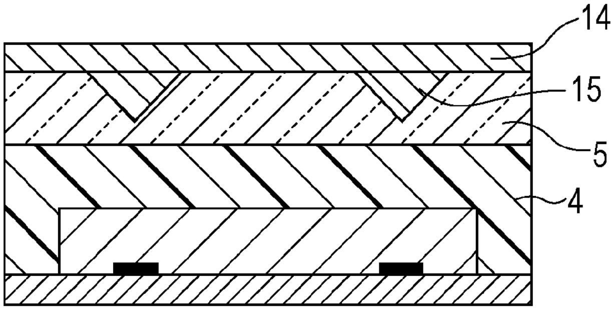
FIGS. 5A and 5B illustrate the embodiment of a method for manufacturing a liquid ejection head.
Figure 5B:
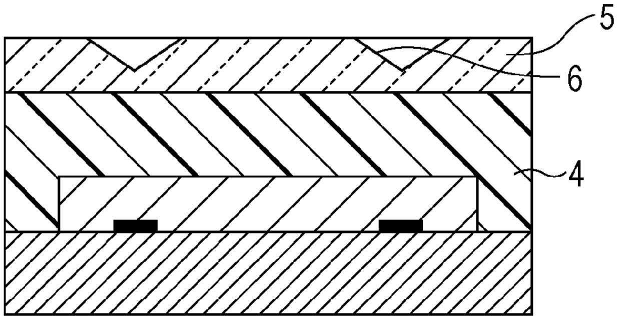

Then, the lens layer 5 is disposed on the negative photosensitive resin layer 4. As illustrated in FIG. 5A, the mold 14 is inverted, and then the lens layer 5 is pressure-bonded to the negative photosensitive resin layer 4. Then, as illustrated in FIG. 5B, the mold 14 is separated to form the lenses 6 in the lens layer 5 disposed on the negative photosensitive resin layer 4.

The lens layer-forming material 16, namely, the lens layer 5 may be formed of a resin. Furthermore, the lens layer 5 may be formed of a material which is highly adhesive to the negative photosensitive resin layer 4 and removable from the mold 14. In particular, the same material as used for the lens layer-forming material 16 in the first embodiment may be employed. The mold 14 may be also formed of the same material as mentioned in the first embodiment. In the second embodiment, however, the mold 14 may be composed of quartz, which can readily transmit light used for alignment and thereby facilitates alignment, because alignment accuracy is needed during bonding of the negative photosensitive resin layer 4 and the lens layer 5.

In the second embodiment, the lens layer 5 has been formed on the mold 14 having the protrusion patterns 15 before the lens layer 5 is pressure-bonded to the negative photosensitive resin layer 4. After the pressure-bonding of the lens layer 5 onto the negative photosensitive resin layer 4 and the formation of the lens 6, a liquid ejection head is manufactured as in FIGS. 2F to 2H in the first example.

In the second embodiment, each ejection port 11 of the produced liquid ejection head has a tapered shape. Furthermore, since the lens layer 5 is removed, the ejection port-opening surface can be made flat, and a liquid adhering to part of the ejection port-opening surface near the opening of each ejection port 11 can be smoothly wiped off with a blade.

Third Embodiment

The third embodiment is different from the first embodiment in that the formation of the lenses 6 is changed after the process illustrated in FIG. 2B.

Figure 6A:
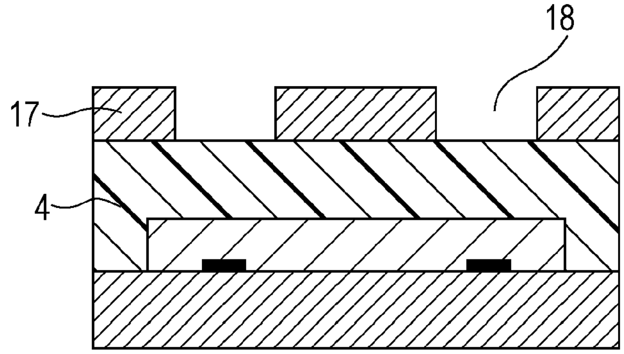
FIGS. 6A and 6B illustrate another embodiment of a method for manufacturing a liquid ejection head.

As illustrated in FIG. 6A, a frame layer 17 is formed on the negative photosensitive resin layer 4. The frame layer 17 has gaps 18. The frame layer 17 may be formed of a resin and, in particular, may be formed of a photosensitive resin in view of formation of the gaps 18. The frame layer 17 can be formed through, for instance, applying a photosensitive resin onto the negative photosensitive resin layer 4 by spin coating and then patterning the applied photosensitive resin by photolithography. A photosensitive resin can be also applied by, for example, slit coating or laminating, and application of a photosensitive resin may be carried out such that the negative photosensitive resin layer 4 and the material of the frame 17 remain immiscible to each other. Hence, a technique for forming the frame layer 17 may involve dissolving the material of the frame layer 17 in a solvent, applying the solution onto a film such as a PET film, processing the film into a dry film, and laminating the dry film on the negative photosensitive resin layer 4 with a laminator.

Figure 6B:
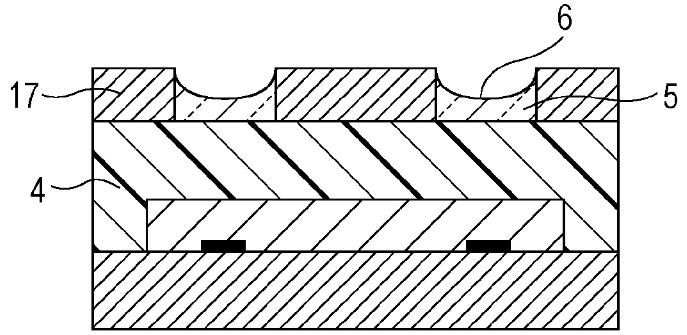

Then, the lens layer 5 is formed in each gap 18 to form the lens 6. In particular, a lens layer-forming material, such as a resin and a liquid, is placed to each gap 18, and this lens layer-forming material is processed into the lens layer 5. In the case where a resin is used to form each lens layer 5, a resin is placed to the gap 18. Examples of a technique for placing a resin to each gap 18 include a technique in which a resin dissolved in a solvent is placed to the gap 18 and a technique in which the resin material is formed into a dry film and then laminated inside the gap 18. In the case where a liquid is used to form each lens layer 5, a liquid is placed to the gap 18. A liquid which does not dissolve the negative photosensitive resin layer 4 and the frame 17 may be employed, and a liquid having a high boiling point and vapor pressure may be used. Specifically, for instance, various oils such as a silicone oil, water-soluble solvents, and organic solvents may be used. In particular, a silicone oil may be used to form a good lens 6. As illustrated in FIG. 6B, an inclined surface is formed in each lens layer 5 formed in the gap 18 owing to, for example, an effect of surface tension and serves as the lens 6.

The frame layer 17 needs to transmit light used for patterning the negative photosensitive resin layer 4. The frame layer 17 may transmit not less than 50% of light used for patterning the negative photosensitive resin layer 4 (light transmittance of not less than 50%). In addition, the frame layer 17 may be readily removed after curing of the negative photosensitive resin layer 4. The frame layer 17 may be formed of a resin, in particular, a photosensitive resin as described above; in view of removal thereof, the frame layer 17 may be formed of a positive photosensitive resin. Examples of the resin used for forming the frame layer 17 include novolac-naphthoquinone resists, vinyl ketone-based polymeric compounds such as polymethyl isopropenyl ketone and polyvinyl ketone, copolymers of methacrylic acid and methyl methacrylate, and polyvinyl alcohol-based resists. In order to form the gaps 18 in the frame layer 17, a resist may be applied onto the frame layer 17 to form a mask. In this case, the frame layer 17 may be formed of cyclized rubbers such as polyisoprene rubber; epoxy resins such as a bisphenol A epoxy resin, a phenol novolac epoxy resin, a cresol novolac epoxy resin, and multifunctional epoxy resin having an oxycyclohexane skeleton; and alkylsiloxane-containing epoxy resins.

After the lenses 6 are formed above the negative photosensitive resin layer 4, a liquid ejection head is manufactured as in FIGS. 2F to 2H in the first embodiment. The frame layer 17 and each lens layer 5 may be removed as with the unexposed part of the negative photosensitive resin layer 4 or may be removed with a common stripping solution or a solvent such as xylene.

In the third embodiment, each ejection port 11 of the produced liquid ejection head has a tapered shape. Furthermore, since the lens layer 5 is removed, the ejection port-opening surface can be made flat, and a liquid adhering to part of the ejection port-opening surface near the opening of each ejection port 11 can be smoothly wiped off with a blade.

Fourth Embodiment

The fourth embodiment is different from the first embodiment in that the formation of the lenses 6 is changed after the process illustrated in FIG. 2B.

Figure 7A:
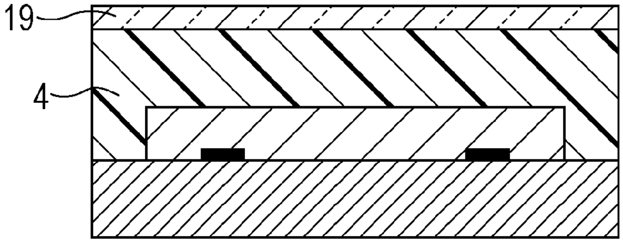
FIGS. 7A and 7B illustrate another embodiment of a method for manufacturing a liquid ejection head.
Figure 7B:
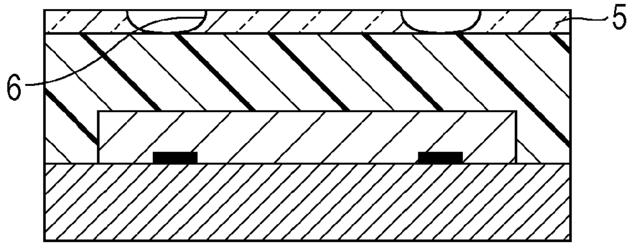

As illustrated in FIG. 7A, a positive photosensitive resin layer 19 is formed on the negative photosensitive resin layer 4. Then, as illustrated in FIG. 7B, the positive photosensitive resin layer 19 is formed into the lens layer 5 having recesses that are to be formed into the lenses 6. Each recess is formed through exposing the positive photosensitive resin layer 19 and then dissolving the exposed part with an alkaline developer for removal thereof. Examples of an exposure apparatus used for the exposure to light include projection exposure apparatuses each having a single-wavelength light source, such as an i-line exposure stepper and a g-line exposure stepper, and projection exposure apparatuses each having a broad-wavelength light source (e.g., a mercury lamp), such as a mask aligner "MPA-600Super" (trade name, manufactured by CANON KABUSHIKI KAISHA). Furthermore, an optical filter which can transmit light having a predetermined wavelength may be used during the exposure to light. Moreover, the pattern in the mask for forming a recess by exposure may be a light-transmitting pattern. The light transmittance within the pattern may be gradually decreased toward the outer side.

A developer is used in a process for forming recesses in the positive photosensitive resin layer 19 and in a development process for removing the positive photosensitive resin layer 19, the recesses being to be formed into the lenses 6. The negative photosensitive resin layer 4 may be insoluble in the developer. The positive photosensitive resin layer 19 may exhibit high resolution which enables smooth photolithographic patterning. From these standpoints, the material used for forming the positive photosensitive resin layer 19 may be a material which contains a novolac resin and a naphthoquinonediazide derivative and which can be developed with an alkaline solution. Specific examples thereof include naphthoquinone-based positive photoresists, such as the OFPR series and the THMR-iP series (trade names, manufactured by TOKYO OHKA KOGYO CO., LTD.) and the NPR series (trade name, manufactured by Nagase ChemteX Corporation).

Examples of a technique for forming the positive photosensitive resin layer 19 include, but are not limited to, spin coating, slit coating, and laminating. In view of the immiscibility of the positive photosensitive resin layer 19 with the negative photosensitive resin layer 4, a technique for forming the positive photosensitive resin layer 19 may involve applying a positive photosensitive resin onto a film such as a PET film, and forming the film into a dry film, and then laminating the dry film on the negative photosensitive resin layer 4 with a laminator.

After the lenses 6 are formed above the negative photosensitive resin layer 4, a liquid ejection head is manufactured as in FIGS. 2F to 2H in the first example. The lens layer 5 is removed as with the unexposed part of the negative photosensitive resin layer 4.

In the fourth embodiment, each ejection port 11 of the produced liquid ejection head has a tapered shape. Furthermore, since the lens layer 5 is removed, the ejection port-opening surface can be made flat, and a liquid adhering to part of the ejection port-opening surface near the opening of each ejection port 11 can be smoothly wiped off with a blade.

Fifth Embodiment

The fifth embodiment is different from the first embodiment in that the formation of the lenses 6 is changed after the process illustrated in FIG. 2B.

Figure 8A:
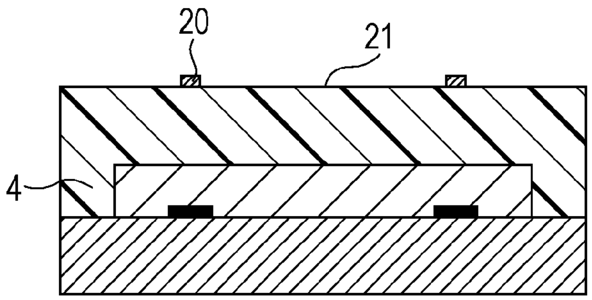
FIGS. 8A and 8B illustrate another embodiment of a method for manufacturing a liquid ejection head.

As illustrated in FIG. 8A, water-repellent patterns 20 are formed on the negative photosensitive resin layer 4. The water-repellent patterns 20 may be formed of a water-repellent material. A region in which the water-repellent patterns 20 are not formed is a non-water-repellent region 21. Needless to say, each water-repellent pattern 20 has higher water repellency than the non-water-repellent region 21 and, for example, exhibits a high water contact angle. The water-repellent patterns 20 may be properly removed after curing of the negative photosensitive resin layer 4. Examples of materials used for forming such water-repellent patterns 20 include perfluoropolyether and perfluoroalkyl. In terms of usability, perfluoropolyether may be employed. A specific example of perfluoropolyether is the FOMBLIN series (trade name, manufactured by Solvay Solexis). Furthermore, a material containing a perfluoropolyether group and a perfluoroalkyl group in part of its structure may be used. Specific examples of such a material include MD40, MD407, and MD700 (trade names, manufactured by SOLVAY SPECIALTY POLYMERS JAPAN K.K.); and KY108 and KY164 (of trade names, manufactured by Shin-Etsu Chemical Co., Ltd.). In the case where such materials are used, each material can be appropriately diluted with a solvent to adjust its viscosity and concentration to be suitable for use. Examples of the solvent usable in this case include fluorine-based solvents and organic solvents which are generally used.

Solutions exhibiting low global warming potential may be used as fluorine-based solvents. Specific examples of such solutions include Novec7100, Novec7200, and Novec7300 (trade names, manufactured by Sumitomo 3M Limited); and AC-6000 (trade name, manufactured by ASAHI GLASS CO., LTD.).

The shape of each water-repellent pattern 20 is similar to the shape of the ejection port 11 to be formed; when the water-repellent pattern 20 is viewed from the above, the center thereof may be aligned with the center of the ejection port 11. Each water-repellent pattern 20 is smaller than the ejection port 11 when viewed from the above, but the size of the water-repellent pattern 20 may be appropriately adjusted on the basis of the taper angle of each ejection port 11. The height of each water-repellent pattern 20 may be not less than 5 μm to properly form the lens layer 5. The height may be not more than 50 μm because it is difficult to remove the water-repellent patterns 20 having an excessively large height.

The water-repellent patterns 20 can be formed by appropriately selecting a technique such as offset printing, micro-contact printing, or ink jet recording with a piezoelectric device or a heating device. Before formation of the water-repellent patterns 20, the surface of the negative photosensitive resin layer 4 may be subjected to silane treatment or dry etching to enhance the adhesion of the water-repellent patterns 20 onto the negative photosensitive resin layer 4 or to reduce bleeding of the water-repellent patterns 20 on the negative photosensitive resin layer 4.

Figure 8B:
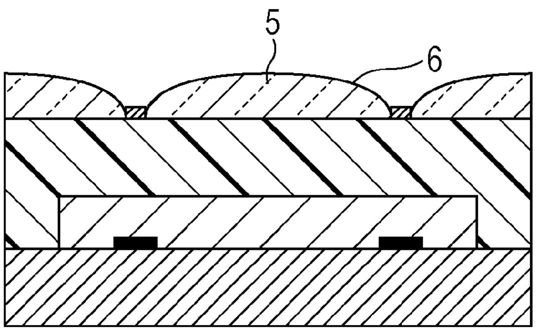

Then, the lens layer 5 and the lenses 6 are formed. A liquid containing a lens layer-forming material used for forming the lens layer 5 is applied onto the negative photosensitive resin layer 4. The liquid containing a lens layer-forming material may have the following characteristics: being less likely to dissolve the negative photosensitive resin layer 4 and the water-repellent patterns 20, contacting the non-water-repellent region 21 at a low contact angle, and being capable of sufficiently transmitting light used for patterning the negative photosensitive resin layer 4. Liquids each having high boiling point and vapor pressure can be used for such a liquid, and specific examples thereof include nonreactive silicone oils in which a hydrophilic organic group, such as a polyether group, is substituted for one of methyl groups of dimethylpolysiloxane. The liquid containing a lens layer-forming material can be applied onto the negative photosensitive resin layer 4 by, for example, slit coating with a bar coater or another machine; ink jet recording with a piezoelectric device, heating device, or another device; spraying; or immersion. The lens layer 5 is formed on the negative photosensitive resin layer 4 in this manner. Since the water-repellent patterns 20 are formed on the negative photosensitive resin layer 4, the liquid containing a lens layer-forming material moves from the surfaces of the water-repellent patterns 20 to the surface of the non-water-repellent region 21. The lens layer 5 having slopes that serve as the lenses 6 is thus formed as illustrated in FIG. 8B. Furthermore, heating, vibration, air spray, or another process may be additionally carried out. Depending on the material, thickness, or formation process of the lens layer 5, the shape of each lens 6 in the cross section in FIG. 8B can be represented by, for instance, an approximation of an ellipse. Hence, the material or the formation process of the lens layer 5 is determined to obtain an approximation on the basis of the tapered shape of an intended ejection port. The size of each water-repellent pattern 20 is determined on the basis of the size of an intended ejection port.

After the lenses 6 are formed above the negative photosensitive resin layer 4, a liquid ejection head is manufactured as in FIGS. 2F to 2H in the first embodiment. The water-repellent patterns 20 and the lens layer 5 are removed as with the unexposed part of the negative photosensitive resin layer 4.

In the fifth embodiment, each ejection port 11 of the produced liquid ejection head has a tapered shape. Furthermore, since the lens layer 5 is removed, the ejection port-opening surface can be made flat, and a liquid adhering to part of the ejection port-opening surface near the opening of each ejection port 11 can be smoothly wiped off with a blade.

EXAMPLES

The present invention will now be described further in detail with reference to Examples of the present invention.

Example 1

A liquid ejection head was manufactured through processes illustrated in FIGS. 2A to 2H. Polymethyl isopropenyl ketone (trade name: ODUR-1010, manufactured by TOKYO OHKA KOGYO CO., LTD.) was applied to a thickness of 14.0 μm onto the substrate 1 on which the energy-generating devices 2 formed of TaSiN had been previously disposed. Then, the pattern 3 that was a mold for a liquid channel was formed with an exposure apparatus (trade name: UX3000, manufactured by USHIO INC.) (FIG. 2A). Then, a cationically polymerizable epoxy resin composition containing the components shown in Table 1 was applied to a thickness of 25.0 μm from the surface of the substrate 1 so as to coat the pattern 3, and the product was heated at 100° C. for 5 minutes to form the negative photosensitive resin layer 4 (FIG. 2B).

TABLE 1

| Material | Content (parts by mass) |
|---|---|
| Epoxy resin (trade name: EHPE-3150, manufactured by DAICEL CORPORATION) | 100 |
| Cationic polymerization initiator (trade name: SP-172, manufactured by ADEKA CORPORATION) | 6 |
| Silane coupling agent (3-glycidoxypropyltrimethoxysilane) | 5 |
| Xylene (manufactured by KISHIDA CHEMICAL Co., Ltd.) | 70 |
| Additive (trade name: 1,4-HFAB, manufactured by Central Glass Co., Ltd.) | 20 |

Then, a dry film of polyisoprene rubber (trade name: OBC, manufactured by TOKYO OHKA KOGYO CO., LTD.) that served as the lens layer-forming material 16 was formed on the negative photosensitive resin layer 4 by a lamination method so as to have a thickness of 11.0 μm (FIG. 2C).

Then, the mold 14 having the conical protrusion patterns 15 each having an apex angle of 120° (incident angle $\Phi 1$=30°), a height of 7.5 μm, and a diameter of 26.0 μm at the bottom was pressed against the lens layer-forming material 16 such that 5.0 μm of each protrusion pattern 15 penetrated into the lens layer-forming material 16 in the height direction of the protrusion pattern 15 (FIG. 2D). This process was carried out at a temperature of the mold 14 of 60° C. and a transfer pressure of 0.2 MPa. Then, the protrusion patterns 15 were separated to complete the formation of the lens layer 5 having the lenses 6 (FIG. 2E).

Then, the negative photosensitive resin layer 4 was exposed to a pattern of light through the lenses 6 and the photomask 8 having the light-shielding pattern 7 covering regions to be formed into ejection ports. An i-line exposure stepper (manufactured by CANON KABUSHIKI KAISHA) was used as an exposure apparatus, and the exposure dose was 4000 J/m$^2$. The light-shielding pattern 7 had a round shape having a diameter of 16.0 μm. After the exposure, the negative photosensitive resin layer 4 was heated at 100° C. for 4 minutes (thermal treatment) to cure the exposed part of the negative photosensitive resin layer 4, thereby forming the channel-forming member 9 (FIG. 2F).

Then, a mixture liquid of xylene/methyl isobutyl ketone (mass ratio: 6/4) was used to remove the unexposed part of the negative photosensitive resin layer 4 and the lens layer 5, thereby forming the ejection ports 11 (FIG. 2G).

Then, a mask was disposed on the back surface (side opposite to the top surface) of the substrate 1, and the side of the top surface of the substrate 1 was protected by a rubber film. In this state, the substrate 1 was anisotropically etched from the back surface side with TMAH to form the supply port 13 in the substrate 1. The rubber film was removed after the anisotropic etching, the product was exposed from the top surface side with an exposure apparatus (trade name: UX3000, manufactured by USHIO INC.) to decompose the pattern 3, and the pattern 3 was removed by being dissolved with methyl lactate. The liquid channel 12 was formed in this manner (FIG. 2H). The channel-forming member 9 was then heated at 200° C. for an hour, and electric connection and an ink-supplying portion were formed. Through these processes, a liquid ejection head was manufactured.

Each ejection port 11 of the liquid ejection head manufactured in Example 1 had a taper angle θ of 76°.

Example 2

Figure 10A:
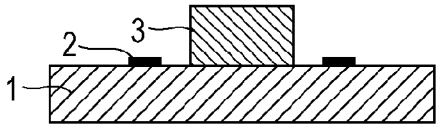
FIGS. 10A to 10F illustrate an example of a method for manufacturing a liquid ejection head.
Figure 10D:
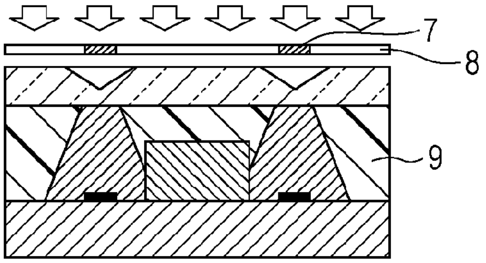
Figure 10B:
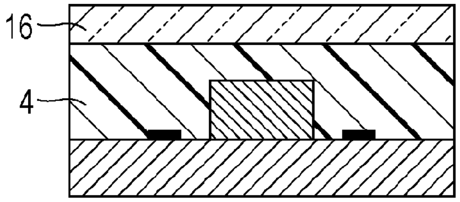

A liquid ejection head was manufactured through processes illustrated in FIGS. 10A to 10F. Polymethyl isopropenyl ketone (trade name: ODUR-1010, manufactured by TOKYO OHKA KOGYO CO., LTD.) was applied to a thickness of 14.0 μm onto the substrate 1 on which the energy-generating devices 2 formed of TaSiN had been previously disposed. Then, the pattern 3 that was a mold for a liquid channel was formed with an exposure apparatus (trade name: UX3000, manufactured by USHIO INC.) (FIG. 10A). The pattern 3 did not cover the energy-generating devices 2 in Example 2 while covering the energy-generating devices 2 in Example 1. Then, TMMR S2000 (trade name, manufactured by TOKYO OHKA KOGYO CO., LTD.) was prepared and applied to a thickness of 25.0 μm from the surface of the substrate 1 so as to coat the pattern 3, and the product was heated at 100° C. for 5 minutes to form the negative photosensitive resin layer 4. Then, a dry film of polyisoprene rubber (trade name: OBC, manufactured by TOKYO OHKA KOGYO CO., LTD.) that served as the lens layer-forming material 16 was formed on the negative photosensitive resin layer 4 by a lamination method so as to have a thickness of 11.0 μm (FIG. 10B).

Then, a mold having conical protrusion patterns each having an apex angle of 100° (incident angle Φ1=40°), a height of 7.5 μm, and a diameter of 18.0 μm at the bottom was pressed against the lens layer-forming material 16 such that 5.0 μm of each protrusion pattern penetrated into the lens layer-forming material 16 in the height direction of the protrusion pattern. This process was carried out at a mold temperature of 60° C. and a transfer pressure of 0.2 MPa. Then, the protrusion patterns were separated to complete the formation of the lens layer 5 having the lenses 6 (FIG. 10C).

The negative photosensitive resin layer 4 was exposed to a pattern of light through the lenses 6 and the photomask 8 having the light-shielding pattern 7 covering regions to be formed into ejection ports. An i-line exposure stepper (manufactured by CANON KABUSHIKI KAISHA) was used as an exposure apparatus, and the exposure dose was 3000 J/$m^2$. The light-shielding pattern 7 had a round shape having a diameter of 16.0 μm. After the exposure, the negative photosensitive resin layer 4 was heated at 100° C. for 4 minutes to cure the exposed part of the negative photosensitive resin layer 4, thereby forming the channel-forming member 9 (FIG. 10D).

Figure 10E:
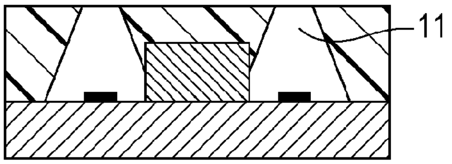
Figure 10C:
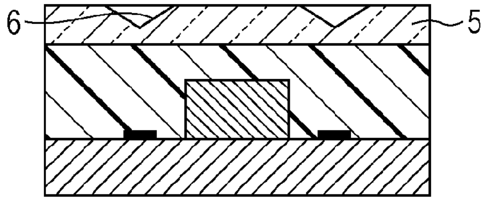

Then, a mixture liquid of xylene/methyl isobutyl ketone (mass ratio: 6/4) was used to remove the unexposed part of the negative photosensitive resin layer 4 and the lens layer 5 to form the ejection ports 11 (FIG. 10E).

Figure 10F:
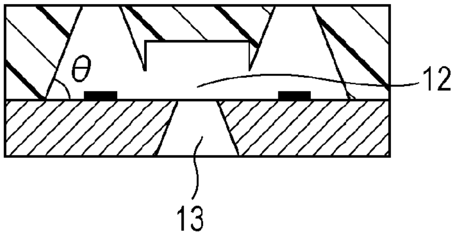

Then, a mask was disposed on the back surface (side opposite to the top surface) of the substrate 1, and the side of the top surface of the substrate 1 was protected by a rubber film. In this state, the substrate 1 was anisotropically etched from the back surface side with TMAH to form the supply port 13 in the substrate 1. The rubber film was removed after the anisotropic etching, the product was again exposed from the top surface side with an exposure apparatus (trade name: UX3000, manufactured by USHIO INC.) to decompose the pattern 3, and the pattern 3 was removed by being dissolved with methyl lactate. The liquid channel 12 was formed in this manner (FIG. 10F). Then, the channel-forming member 9 was heated at 200° C. for an hour, and electric connection and an ink-supplying portion were formed. Through these processes, a liquid ejection head was manufactured.

Each ejection port 11 of the liquid ejection head manufactured in Example 2 had a taper angle θ of 70°.

Example 3

Figure 11A:
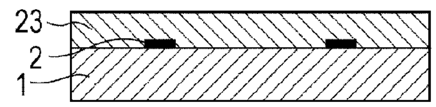
FIGS. 11A to 11I illustrate another example of a method for manufacturing a liquid ejection head.

A liquid ejection head was manufactured through processes illustrated in FIGS. 11A to 11I. A cationically polymerizable epoxy resin composition containing the components shown in Table 1 was applied to a thickness of 15.0 μm onto the substrate 1 on which the energy-generating devices 2 formed of TaSiN had been previously disposed, and the product was heated at 100° C. for 5 minutes to form a resin layer 23 (FIG. 11A).

Figure 11B:
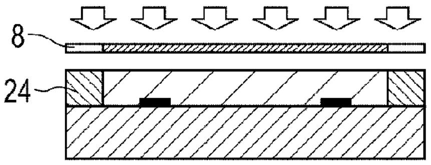
Figure 11C:
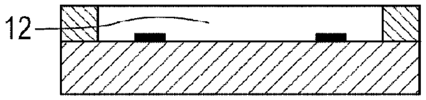

Then, the resin layer 23 was exposed to a pattern of light through the photomask 8 with an i-line exposure stepper (manufactured by CANON KABUSHIKI KAISHA). The exposure dose was 4000 J/$m^2$. After the exposure, the product was heated at 90° C. for 3 minutes to form a base 24 of a channel-forming member (FIG. 11B). Then, the non-cured part of the resin layer 23 was removed by being dissolved to form the liquid channel 12 (FIG. 11C).

Figure 11D:
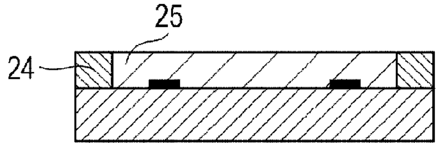

Then, polymethyl isopropenyl ketone (trade name: ODUR-1010, manufactured by TOKYO OHKA KOGYO CO., LTD.) was applied to a thickness of 18.0 μm from the substrate 1 to form a support member 25. The base 24 and the support member 25 were flattened by chemical mechanical polishing (CMP) so as to have a thickness of 16.0 μm from the substrate 1 (FIG. 11D).

Figure 11E:
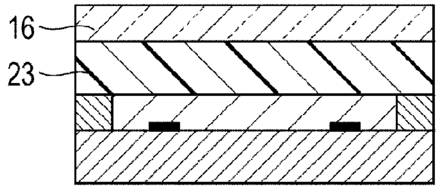

Then, the cationically polymerizable epoxy resin composition containing components shown in Table 1 was applied onto the base 24 and the support member 25 to a thickness of 10.0 μm to form another resin layer 23 and then heated at 90° C. for 5 minutes. A film of a polyisoprene rubber (trade name: OBC, manufactured by TOKYO OHKA KOGYO CO., LTD.) that served as the lens layer-forming material 16 was formed on the resin layer 23 so as to have a thickness of 11.0 μm (FIG. 11E).

Figure 11F:
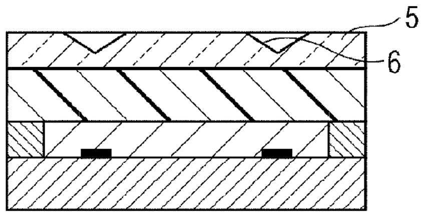

Then, the mold 14 having conical protrusion patterns each having an apex angle of 120° (incident angle Φ1=30°), a height of 7.5 μm, and a diameter of 26.0 μm at the bottom was pressed against the lens layer-forming material 16 such that 5.0 μm of each protrusion pattern penetrated into the lens layer-forming material 16 in the height direction of the protrusion pattern. This process was carried out at a temperature of the mold 14 of 60° C. and a transfer pressure of 0.2 MPa. Then, the protrusion patterns were separated to complete the formation of the lens layer 5 having the lenses 6 (FIG. 11F).

Figure 11G:
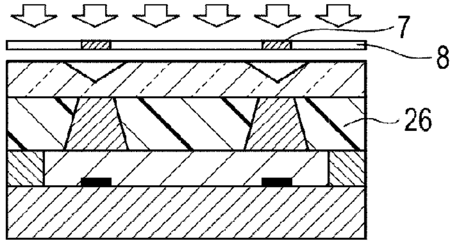

Then, the resin layer 23 was exposed to a pattern of light through the lenses 6 and the photomask 8 having the light-shielding pattern 7 covering regions to be formed into ejection ports. An i-line exposure stepper (manufactured by CANON KABUSHIKI KAISHA) was used as an exposure apparatus, and the exposure dose was 4000 J/m$^2$. The light-shielding pattern 7 had a round shape having a diameter of 16.0 μm. After the exposure, the resin layer 23 was heated at 100° C. for 4 minutes to cure the exposed part of the resin layer 23, thereby forming an orifice plate 26 that was part of the channel-forming member (FIG. 11G).

Figure 11H:
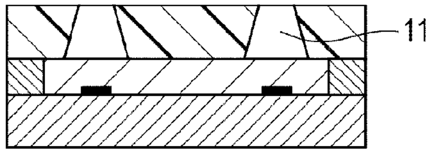

Then, a mixture liquid of xylene/methyl isobutyl ketone (mass ratio: 6/4) was used to remove the unexposed part of the resin layer 23 and the lens layer 5 to form the ejection ports 11 (FIG. 11H).

Figure 11I:
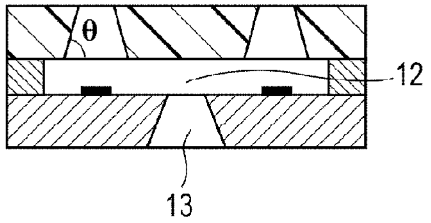

The supply port 13 was finally formed as in Example 1, and the support member 25 was removed by being dissolved to form the liquid channel 12. A liquid ejection head was manufactured in this manner (FIG. 11I).

Each ejection port 11 of the liquid ejection head manufactured in Example 3 had a taper angle θ of 76°.

Example 4

Figure 12A:
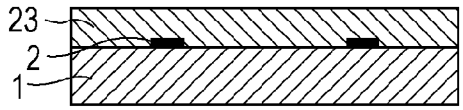
FIGS. 12A to 12F illustrate another example of a method for manufacturing a liquid ejection head.
Figure 12D:
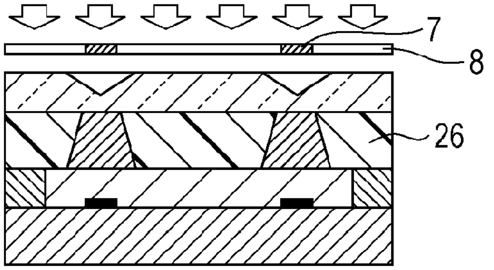
Figure 12B:
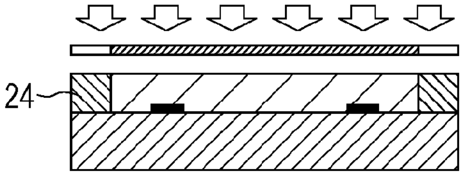

A liquid ejection head was manufactured through processes illustrated in FIGS. 12A to 12F. The process illustrated in FIG. 12A was the same as the process in FIG. 11A in Example 3. The resin layer 23 was exposed to a pattern of light through the photomask 8 with an i-line exposure stepper (manufactured by CANON KABUSHIKI KAISHA). The exposure dose was 8000 J/m$^2$. After the exposure, the product was heated at 90° C. for 3 minutes to form the base 24 of a channel-forming member (FIG. 12B). The unexposed part on the inside of the base 24 served as a template for forming a pattern of the liquid channel 12.

Then, a dry film 27 containing a cationically polymerizable epoxy resin composition composed of components shown in Table 2 was applied onto the base 24 and the unexposed part of the resin layer 23 by a lamination method so as to have a thickness of 10.0 μm and then heated at 90° for 5 minutes. A dry film of a polyisoprene rubber (trade name: OBC, manufactured by TOKYO OHKA KOGYO CO., LTD.) was formed on the dry film 27 by a lamination method so as to have a thickness of 11.0 μm. A mold having conical protrusion patterns each having an apex angle of 120° (incident angle Φ1=30°), a height of 7.5 μm, and a diameter of 26.0 μm at the bottom was subsequently pressed against the dry film of a polyisoprene rubber such that 5.0 μm of each protrusion pattern penetrated into this dry film in the height direction of the protrusion pattern. This process was carried out at a mold temperature of 60° C. and a transfer pressure of 0.2 MPa. Then, the protrusion patterns were separated to form the dry film of a polyisoprene rubber into the lens layer 5 having the lenses 6 (FIG. 12C).

TABLE 2

| Material | Content (parts by mass) |
|---|---|
| Epoxy resin (trade name: EHPE-3150, manufactured by DAICEL CORPORATION) | 100 |
| Cationic polymerization initiator (trade name: SP-172, manufactured by ADEKA CORPORATION) | 6 |
| Silane coupling agent (trade name: A-187 manufactured by GE Toshiba Silicones Co., Ltd.) | 5 |
| Additive (trade name: 1,4-HFAB, manufactured by Central Glass Co., Ltd.) | 20 |
| Sensitizer (trade name: SP-100 manufactured by ADEKA CORPORATION) | 2.9 |

Then, the dry film 27 was exposed to a pattern of light through the lenses 6 and the photomask 8 having the light-shielding pattern 7 covering regions to be formed into ejection ports. An i-line exposure stepper (manufactured by CANON KABUSHIKI KAISHA) was used as an exposure apparatus. The exposure dose was 800 J/m$^2$. The light-shielding pattern 7 had a round shape having a diameter of 16.0 μm. After the exposure, the dry film 27 was heated at 100° C. for 4 minutes to cure the exposed part of the dry film 27, thereby forming an orifice plate 26 that was part of the channel-forming member (FIG. 12D).

Figure 12E:
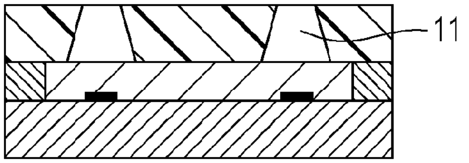
Figure 12C:
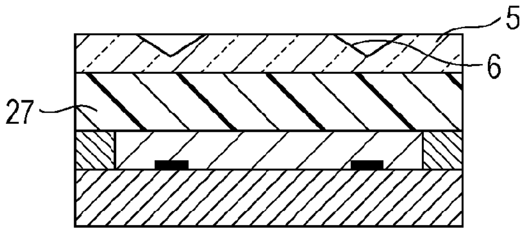

Then, a mixture liquid of xylene/methyl isobutyl ketone (mass ratio: 6/4) was used to remove the unexposed part of the dry film 27 and the lens layer 5, thereby forming the ejection ports 11 (FIG. 12E).

Figure 12F:
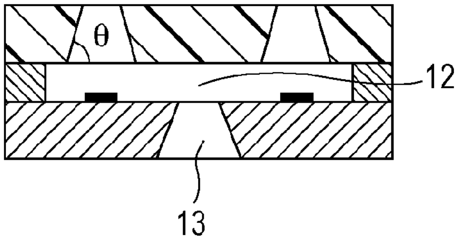

The supply port 13 was finally formed as in Example 1, and the template was removed by being dissolved to form the liquid channel 12. A liquid ejection head was manufactured in this manner (FIG. 12F).

Each ejection port 11 of the liquid ejection head manufactured in Example 4 had a taper angle θ of 76°.

Example 5

A liquid ejection head was manufactured through processes illustrated in FIGS. 13A to 13G. The processes up to and including FIG. 13B were the same as the processes up to and including FIG. 2B in Example 1.

Figure 13A:
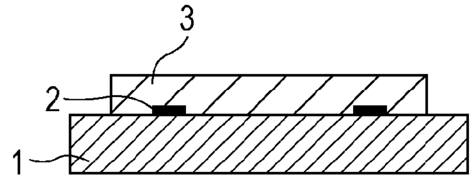
FIGS. 13A to 13G illustrate another example of a method for manufacturing a liquid ejection head.
Figure 13E:
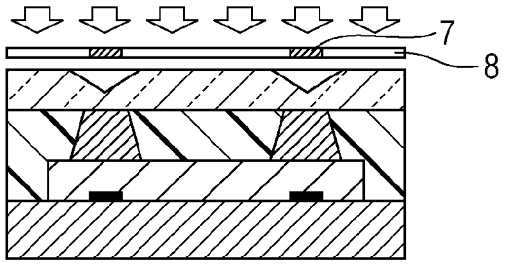
Figure 13B:
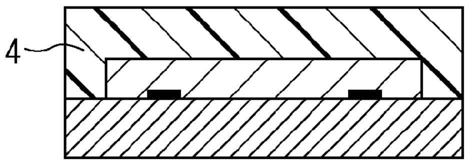
Figure 13F:
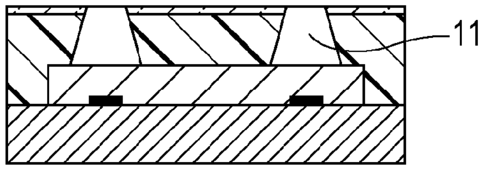
Figure 13C:
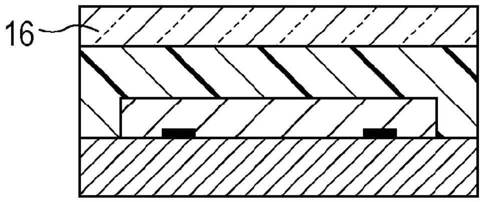

After the formation of the negative photosensitive resin layer 4, a dry film of an epoxy resin composition composed of the components shown in Table 3 was formed as the lens layer-forming material 16 on the negative photosensitive resin layer 4 by a lamination method so as to have a thickness of 6.0 μm (FIG. 13C).

TABLE 3

| Material | Content (parts by mass) |
|---|---|
| Epoxy resin (trade name: EHPE-3150, manufactured by DAICEL CORPORATION) | 100 |
| Component A (alkylsiloxane-containing epoxy resin) | 20 |
| Cationic polymerization initiator (trade name: SP-170, manufactured by ADEKA CORPORATION) | 2 |
| Silane coupling agent (3-glycidoxypropyltrimethoxysilane) | 4 |

The component A in Table 3 was an alkylsiloxane-containing epoxy resin having a structural units represented by the following general formulae (a) and (b).

(a)

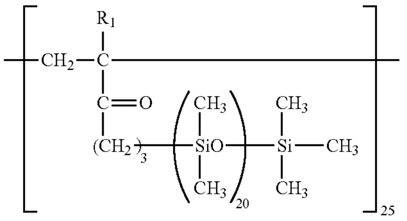

(b)

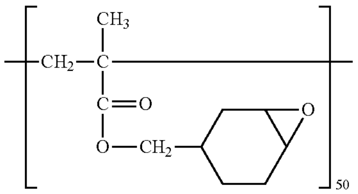

Figure 13D:
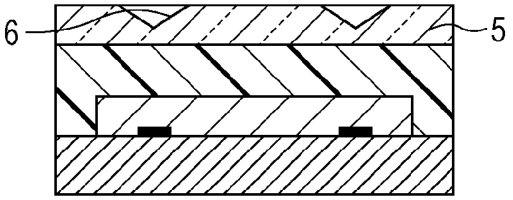

Then, a mold having conical protrusion patterns each having an apex angle of 150° (incident angle Φ1=150°), a height of 6.0 μm, and a diameter of 45.0 μm at the bottom was pressed against the lens layer-forming material 16 such that 4.0 μm of each protrusion pattern penetrated into the lens layer-forming material 16 in the height direction of the protrusion pattern. This process was carried out at a mold temperature of 60° C. and a transfer pressure of 0.2 MPa. Then, the protrusion patterns were separated to complete the formation of the lens layer 5 having the lenses 6 (FIG. 13D).

Then, the negative photosensitive resin layer 4 was exposed to a pattern of light as in Example 1 (FIG. 13E). A mixture liquid of xylene/methyl isobutyl ketone (mass ratio: 6/4) was used to remove the unexposed part of the negative photosensitive resin layer 4 and the lens layer 5 to form the ejection ports 11 (FIG. 13F). Through these processes, water repellency was imparted to the ejection port 11-opening surface. It is believed that water-repellency was imparted to the ejection port 11-opening surface for the following reason: the contact surface of the lens layer 5 to the negative photosensitive resin layer 4 and the region near such a surface were cured into a cured portion at the same time as the curing of the negative photosensitive resin layer 4, and the cured portion having water repellency thus remained on the ejection port 11—opening surface even after the removal of the lens layer 5. In Example 5, the cured portion having water repellency was in the form of a layer and had a thickness of 0.5 μm.

Figure 13G:
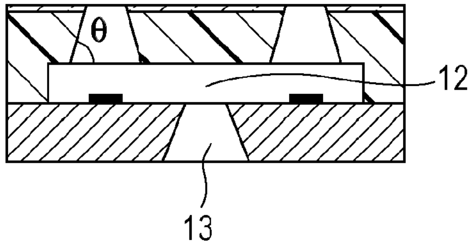

The supply port 13 was finally formed as in Example 1, and the pattern 3 was removed by being dissolved to form the liquid channel 12. A liquid ejection head was manufactured in this manner (FIG. 13G).

Each ejection port 11 of the liquid ejection head manufactured in Example 5 had a taper angle θ of 82°.

Example 6

The lens layer 5 was formed through the process illustrated in FIGS. 4A and 4B. The mold 14 was formed of quartz. Each protrusion pattern 15 was also formed of quartz and had a conical shape having an apex angle of 120° (incident angle Φ1=30°), a height of 7.5 μl, and a diameter of 26.0 μm at the bottom. Then, a solvent-type mold releasing agent (trade name: KS-707, manufactured by Shin-Etsu Chemical Co., Ltd.) was applied onto the surfaces of the mold 14 and each protrusion pattern 15 (not illustrated). Polyisoprene rubber (trade name: OBC, manufactured by TOKYO OHKA KOGYO CO., LTD.) was applied onto the surface of the mold 14 by spin coating to form the lens layer-forming material 16 (FIG. 4A). Then, the mold 14 was heated with a hot plate at 120° for 6 minutes to form the lens layer 5 (FIG. 4B).

Then, the negative photosensitive resin layer 4 is formed as in Example 1 through the processes up to and including FIG. 2B so as to overlie the substrate 1, and the mold 14 was inverted to pressure-bond the lens layer 5 to the negative photosensitive resin layer 4 as illustrated in FIG. 5A. A temperature of the mold 14 was 60° C., and a transfer pressure was 0.2 MPa. In this case, alignment was performed such that the conical protrusions were placed above positions at which ejection ports were to be formed later. Then, the mold 14 was separated as illustrated in FIG. 5B to form the lenses 6 in lens layer 5 disposed on the negative photosensitive resin layer 4.

After the lens layer 5 and lenses 6 overlying the negative photosensitive resin layer 4 were formed in this manner, a liquid ejection head was manufactured as in FIGS. 2F to 2H in Example 1.

Each ejection port of the liquid ejection head manufactured in Example 6 had a taper angle θ of 76°.

Example 7

Polymethyl isopropenyl ketone (trade name: ODUR-1010, manufactured by TOKYO OHKA KOGYO CO., LTD.) replaced polyisoprene rubber (trade name: OBC, manufactured by TOKYO OHKA KOGYO CO., LTD.) used for the lens layer-forming material 16 in Example 6. Except this change, a liquid ejection head was manufactured as in Example 6.

Each ejection port of the liquid ejection head manufactured in Example 7 had a taper angle θ of 76°.

Example 8

The processes up to and including FIG. 2B were carried out as in Example 1. Then, a g-line positive photosensitive resin (trade name: OFPR-800, manufactured by TOKYO OHKA KOGYO CO., LTD.) was laminated on the negative photosensitive resin layer 4 to a thickness of 5.0 μm. Then, patterning was carried out with a g-line exposure stepper (manufactured by CANON KABUSHIKI KAISHA) and a photomask, and the pattern was subsequently developed with an aqueous tetramethylammonium hydroxide solution (trade name: NMD-3, manufactured by TOKYO OHKA KOGYO CO., LTD.) to form the frame layer 17 having the gaps 18 (FIG. 6A). In this case, since the patterning was carried out with the g-line, the photosensitive resin layer 4 exhibiting small sensitivity to the g-line was not substantially influenced by the exposure.

Then, in order to form the lens layer 5 having the lenses 6, a silicone oil that was the material used for forming the lenses 6 was ejected to the gaps 18 with a liquid ejection apparatus including a piezoelectric device to place the silicone oil to the gaps 18 (FIG. 6B).

Then, a liquid ejection head was manufactured as in FIGS. 2F to 2H in Example 1. The ejection ports 11 were formed through exposure with an i-line exposure stepper (manufactured by CANON KABUSHIKI KAISHA) at an exposure dose of 10000 J/$m^2$. The light-shielding pattern 7 had a round shape having a diameter of 16.0 μm. The unexposed part of the negative photosensitive resin layer 4 was removed as in Example 1, whereas the frame layer 17 and the lens layer 5 were removed with xylene.

Each ejection port 11 of the liquid ejection head manufactured in Example 8 had a taper angle θ of 76°.

Example 9

An aqueous solution containing polyvinyl alcohol was placed to the gaps 18 in place of the silicone oil used in Example 8. After placing this aqueous solution to the gaps 18, the product was heated at 80° C. for 3 minutes to form the polyvinyl alcohol into a film having a thickness of 5.0 μm, thereby forming the lens layer 5.

Then, a liquid ejection head was manufactured as in Example 8. The ejection ports 11 were formed through exposure with an i-line exposure stepper (manufactured by CANON KABUSHIKI KAISHA) at an exposure dose of 5000 J/$m^2$. The light-shielding pattern 7 had a round shape having a diameter of 16.0 μm. The unexposed part of the negative photosensitive resin layer 4 was removed with methyl isobutyl ketone, and the frame layer 17 and the lens layer 5 were removed with a stripping solution (trade name: remover 1112A, manufactured by Rohm and Haas Electronic Materials Company).

Each ejection port of the liquid ejection head manufactured in Example 9 had a taper angle θ of 76°.

Example 10

The processes up to and including FIG. 2B were carried out as in Example 1. Then, the positive photosensitive resin layer 19 was formed on the negative photosensitive resin layer 4. A dry film of a naphthoquinone-based positive photoresist (trade name: NPR-9630, manufactured by Nagase ChemteX Corporation) was used for the positive photosensitive resin layer 19 and laminated on the negative photosensitive resin layer 4 so as to have a thickness of 4.0 μm (FIG. 7A).

Then, the positive photosensitive resin layer 19 was exposed to a pattern of light with an exposure apparatus (trade name: mask aligner MPA-600Super, manufactured by CANON KABUSHIKI KAISHA). In this case, a filter which was able to transmit the g-line (wavelength: 436 nm) was used. The pattern formed in a mask for forming each recess had a round light-transmitting portion having a diameter of 20.0 μm. An exposure dose was 3000 J/$m^2$, and the focus was 50.0 μm from the surface of the positive photosensitive resin layer 19 in a depth direction. The exposed part was subsequently removed by being dissolved with an alkaline developer (trade name: NMD-3, manufactured by TOKYO OHKA KOGYO CO., LTD.) to form the lens layer 5 having the recesses that served as the lenses 6 (FIG. 7B).

Then, a liquid ejection head was manufactured as in FIGS. 2F to 2H in Example 1. The ejection ports 11 were formed through exposure with an i-line exposure stepper (manufactured by CANON KABUSHIKI KAISHA) at an exposure dose of 10000 J/$m^2$. The light-shielding pattern 7 had a round shape having a diameter of 16.0 μm.

Each ejection port 11 of the liquid ejection head manufactured in Example 10 had a taper angle θ of 75°.

Example 11

In the processes in Example 10, TMMR S2000 (trade name, manufactured by TOKYO OHKA KOGYO CO., LTD.) was used to form the negative photosensitive resin layer 4. Furthermore, OFPR-800 (trade name, manufactured by TOKYO OHKA KOGYO CO., LTD., naphthoquinone-based positive photoresist) replaced NPR-9630 (trade name, manufactured by Nagase ChemteX Corporation, naphthoquinone-based positive photoresist) used in Example 10, and the thickness thereof was 3.0 μm.

The positive photosensitive resin layer 19 was exposed to a pattern of light at an exposure dose of 6000 J/$m^2$, and the pattern formed in a mask for forming each recess had a round shape having a diameter of 22.0 μm and a gradation structure in which light transmittance decreased as the round pattern extended toward the outer side. The ejection ports 11 were formed through exposure with an i-line exposure stepper (manufactured by CANON KABUSHIKI KAISHA) at an exposure dose of 16000 J/$m^2$. Except those changes, a liquid ejection head was manufactured as in Example 10.

Each ejection port of the liquid ejection head manufactured in Example 11 had a taper angle θ of 85°.

Example 12

The positive photosensitive resin layer 19 was laminated so as to have a thickness of 7.0 μm in Example 12, whereas it was laminated so as to have a thickness of 4.0 μm in Example 10.

Then, the positive photosensitive resin layer 19 was exposed to a pattern of light. An i-line exposure stepper (manufactured by CANON KABUSHIKI KAISHA) was used as an exposure apparatus. The pattern formed in a mask for forming each recess had a round light-transmitting portion having a diameter of 20.0 μm. The exposure dose was 4000 J/$m^2$, and focus was 50.0 μm from the surface of the positive photosensitive resin layer 19 in the depth direction. The exposed part was subsequently removed by being dissolved with an alkaline developer (trade name: NMD-3, manufactured by TOKYO OHKA KOGYO CO., LTD.) to form the lens layer 5 having the recesses that served as the lenses 6 (FIG. 7B). Each lens 6 had a depth of 4.7 μm, and a 2,3-μm-thick positive photosensitive resin layer remained at the bottom of each lens 6.

Then, a liquid ejection head was manufactured as in FIGS. 2F to 2H in Example 1. The ejection ports 11 were formed through exposure with an i-line exposure stepper (manufactured by CANON KABUSHIKI KAISHA) at an exposure dose of 20000 J/$m^2$. The light-shielding pattern 7 had a round shape having a diameter of 16.0 μm.

Each ejection port 11 of the liquid ejection head manufactured in Example 12 had a taper angle θ of 70°.

Example 13

The processes up to and including FIG. 2B were carried out as in Example 1. Then, as illustrated in FIG. 8A, the water-repellent patterns 20 were formed on the negative photosensitive resin layer 4. Perfluoropolyether (trade name: KY164, manufactured by Shin-Etsu Chemical Co., Ltd.) containing an alkoxysilane group at its terminal was diluted with a fluorine-based solvent (trade name: AC-6000 manufactured by ASAHI GLASS CO., LTD.) and used as the material of the water-repellent patterns 20. This material was applied onto the negative photosensitive resin layer 4 by offset printing such that the material after being dried had a thickness of 0.2 μm and a diameter of 15.0 μm, thereby forming the water-repellent patterns 20. The shape of each water-repellent pattern 20 was similar to that of an ejection port formed later, and the center of each water-repellent pattern 20 was aligned with the center of the corresponding ejection port.

Then, as illustrated in FIG. 8B, the lens layer 5 and lenses 6 were formed so as to overlie the negative photosensitive resin layer 4. A non-reactive silicone oil in which one of methyl groups of dimethylpolysiloxane had been substituted with a polyether group (hereinafter referred to as modified silicone oil) was applied onto the negative photosensitive resin layer 4 by ink jet recording with a piezoelectric device.

The thickness thereof was 2 μm. The applied modified silicone oil formed an R shape at the boundaries between the water-repellent patterns 20 and the non-water-repellent region 21 owing to the surface tension thereof as illustrated in FIG. 8B, thereby forming the lens layer 5. Some parts of the lens layer 5 served as the lenses 6.

Then, a liquid ejection head was manufactured as in FIGS. 2F to 2H in Example 1. The ejection ports 11 were formed through exposure with an i-line exposure stepper (manufactured by CANON KABUSHIKI KAISHA) at an exposure dose of 4000 J/m$^2$. The light-shielding pattern 7 had a round shape having a diameter of 16.0 μm. The water-repellent pattern 20 and the lens layer 5 were removed with isopropyl alcohol.

Each ejection port 11 of the liquid ejection head manufactured in Example 13 had a taper angle θ of 77°.

Example 14

The water-repellent patterns were formed by ink jet recording with a piezoelectric device in Example 14, whereas they were formed by offset printing in Example 13. The lens layer was formed by offset printing in Example 14, whereas it was formed by ink jet printing in Example 13. In addition, the water-repellent patterns to be formed were changed as described below. A liquid ejection head was manufactured as in Example 13 except those changes.

Figure 14A:
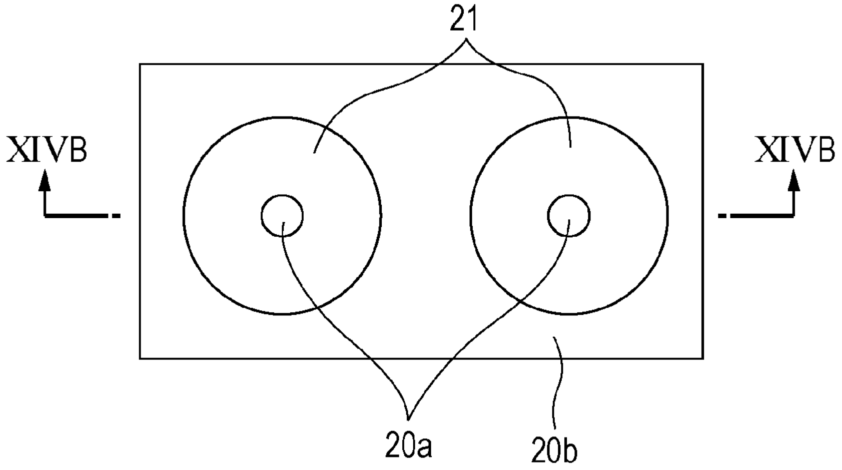
FIGS. 14A and 14B illustrate an example of a water-repellent pattern.
Figure 14B:
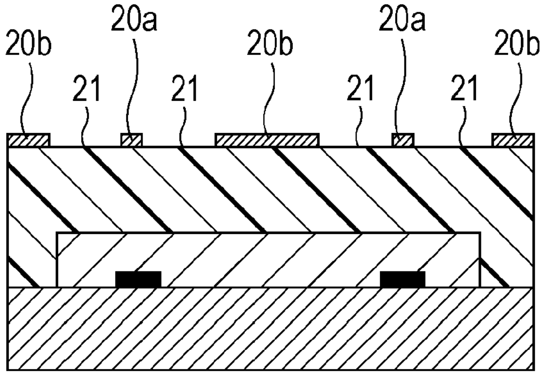

FIGS. 14A and 14B illustrate the water-repellent patterns formed in Example 14. FIG. 14A illustrates a structure when the negative photosensitive resin layer 4 is viewed from above, and FIG. 14B is a cross-sectional view illustrating the structure taken along the line XIVB-XIVB in FIG. 14A. As illustrated in FIGS. 14A and 14B, the water-repellent pattern in Example 14 included inner water-repellent patterns 20*a* and outer water-repellent pattern 20*b*. The region therebetween were regions having no water-repellent patterns, namely, the non-water-repellent regions 21 in which the negative photosensitive resin layer 4 was exposed. Each non-water-repellent region 21 had a round shape having a diameter of 34 μm. Each inner water-repellent pattern 20*a* had a round shape having a diameter of 11 μm. The centers of the inner water-repellent patterns 20*a* and non-water-repellent patterns 21*a* were aligned with the centers of the ejection ports (formed later). The light-shielding pattern 7 had a round shape having a diameter of 15.0 μm, and each ejection port was formed as in Example 13.

Each ejection port of a liquid ejection head manufactured in Example 14 had a taper angle θ of 77°.

Example 15

The thickness of the lens layer-forming material 16 formed in Example 1 was changed from 11.0 μm to 30.0 μm. A liquid ejection head was manufactured as in Example 1 except this change; however, time taken for completely removing the lens layer was much longer than Example 1.

Each ejection port of the liquid ejection head manufactured in Example 15 had a taper angle θ of 76°.

Example 16

The thickness of the lens layer-forming material 16 formed in Example 1 was changed from 11.0 μm to 7.0 μm. A liquid ejection head was manufactured as in Example 1 except this change.

Each ejection port of the liquid ejection head manufactured in Example 16 had a taper angle θ of 76°; however, the ejection port-opening surface was slightly recessed.

Comparative Example

Figure 15A:
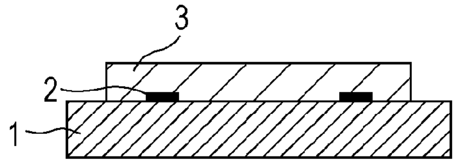
FIGS. 15A to 15F illustrate a comparative example of a method for manufacturing a liquid ejection head.
Figure 15B:
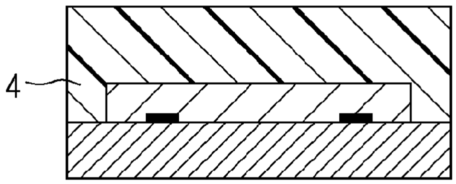

The processes up to and including FIG. 2B were carried out as in Example 1 (FIGS. 15A and 15B).

Figure 15C:
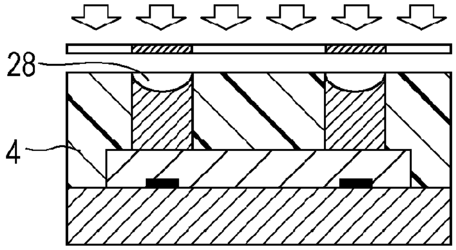

Then, as illustrated in FIG. 15C, the negative photosensitive resin layer 4 was exposed to a pattern of light through a photomask having a light-shielding pattern. An i-line exposure stepper (manufactured by CANON KABUSHIKI KAISHA), was used as an exposure apparatus, and the exposure dose was 2500 J/m$^2$. The light-shielding pattern had a round shape having a diameter of 26.0 μm. After the exposure, the product was heated at 100° C. for 4 minutes to recess the unexposed part of the negative photosensitive resin layer 4 in a parabolic shape, thereby forming recesses 28 (FIG. 15C). Each recess 28 had a diameter of 27.0 μm and a depth of 5.5 μm.

Figure 15D:
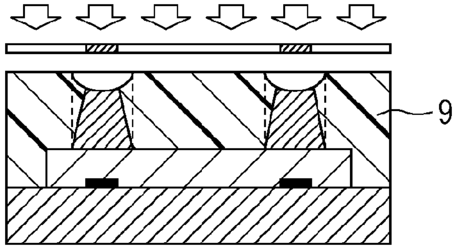

Then, as illustrated in FIG. 15D, part of the negative photosensitive resin layer 4 under each recess 28 was exposed to a pattern of light through a photomask having another light-shielding pattern. An i-line exposure stepper (manufactured by CANON KABUSHIKI KAISHA) was used as an exposure apparatus, and the exposure dose was 3500 J/m$^2$. The light-shielding pattern had a round shape having a diameter of 16.0 μm. After the exposure, the product was heated at 100° C. for 4 minutes to cure the exposed part of the negative photosensitive resin layer 4, thereby forming the channel-forming member 9.

Figure 15E:
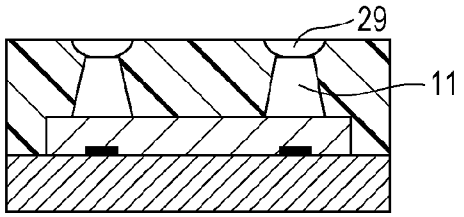

Then, a mixture liquid of xylene/methyl isobutyl ketone (mass ratio: 6/4) was used to remove the unexposed part of the negative photosensitive resin layer 4 to form the ejection ports 11 (FIG. 15E). The bottom of each recess 28 was removed to form a recess 29. The ejection port 11—opening surface had the recesses 29. Each recess 29 had a depth of 3.5 μm.

Figure 15F:
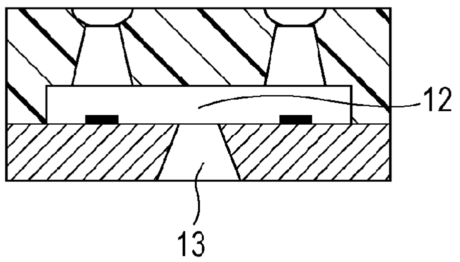

Then, a mask was disposed on the back surface (side opposite to the top surface) of the substrate 1, and the side of the top surface of the substrate 1 was protected by a rubber film. In this state, the substrate 1 was anisotropically etched from the back surface side with TMAH to form the supply port 13 in the substrate 1. The rubber film was removed after the anisotropic etching, the product was exposed from the top surface side with an exposure apparatus (trade name: UX3000, manufactured by USHIO INC.) to decompose the pattern 3, and the pattern 3 was removed by being dissolved with methyl lactate. The liquid channel 12 was formed in this manner (FIG. 15F). The channel-forming member 9 was subsequently heated at 200° C. for an hour, and electric connection and an ink-supplying portion were formed. Through these processes, a liquid ejection head was manufactured.

Each ejection port 11 of the liquid ejection head manufactured in Comparative Example had a taper angle θ of 80°.

Evaluation

Each of the manufactured liquid ejection heads was filled with a black ink, and the ink was continuously ejected from the ejection ports of each liquid ejection head. Then, it was found that ink droplets were ejected in an unintended direction in each liquid ejection head in some cases. Each ejection port-opening surface was observed with an optical microscope, and it was found that ink was adhering to part of the ejection port-opening surface near the openings of some ejection ports. Then, each ejection port-opening surface to which ink had been adhering was wiped with a blade formed of chlorinated butyl rubber to remove the ink adhering to the ejection port-opening surface. After the removal of the ink, an ink was ejected again.

As a result, an ink was properly ejected from the liquid ejection heads manufactured in Examples. Ink droplets were, however, ejected in an unintended direction in the liquid ejection head manufactured in Comparative Example in some cases. Each ejection port-opening surface was therefore observed with an optical microscope again, and it was found that the ink which had been adhering to part of the ejection port-opening surface near the openings of the ejection ports was properly removed in the liquid ejection head manufactured in Example. In contrast, it was found that the ink was remaining on part of the ejection port-opening surface near the openings of the ejection ports, namely in recesses, in the liquid ejection head manufactured in Comparative Example.

The present invention enabled manufacturing of a liquid ejection head which had an ejection port having a tapered shape and in which a liquid adhering to part of an ejection port-opening surface near the opening of an ejection port was able to be sufficiently wiped off with a blade.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-124836 filed May 31, 2012, which is hereby incorporated by reference herein in its entirety.

What is claimed is:

1. A method for manufacturing a liquid ejection head having a substrate and a channel-forming member having an ejection port from which a liquid is ejected, the method comprising the steps of:

(a) forming a negative photosensitive resin layer on or above the substrate;

(b) forming a lens layer on the negative photosensitive resin layer, the lens layer having a lens;

(c) exposing the negative photosensitive resin layer through the lens to form an ejection port in the negative photosensitive resin layer; and (d) removing the lens layer.

2. The method according to claim 1, wherein the lens layer is formed of a resin.

3. The method according to claim 1, wherein a thickness of the lens layer is at least 1.5 times and at most 5.0 times a depth of the lens in a direction perpendicular to a surface of the substrate.

4. The method according to claim 1, further comprising the step of (e) heating the negative photosensitive resin layer between the steps (c) and (d).

5. The method according to claim 1, wherein the ejection port has a tapered shape in which a cross-sectional area taken in a direction parallel to a surface of the substrate decreases as the ejection port extends from the substrate side toward an ejection port-opening surface.

6. The method according to claim 1, wherein the step (b) includes:

applying a lens layer-forming material onto the negative photosensitive resin layer;

pressing a protrusion pattern against the applied lens layer-forming material; and separating the protrusion pattern from the lens layer-forming material.

7. The method according to claim 1, wherein the step (b) includes pressure-bonding the lens layer to the negative photosensitive resin layer to dispose the lens layer on the negative photosensitive resin layer.

8. The method according to claim 7, wherein the lens layer is formed on a mold having a protrusion pattern before the lens layer is pressure-bonded to the negative photosensitive resin layer.

9. The method according to claim 8, wherein the mold is formed of quartz.

10. The method according to claim 1, wherein the step (b) includes:

forming a frame layer having a gap on the negative photosensitive resin layer; and placing a lens layer-forming material to the gap of the frame layer to form the lens layer-forming material into a lens layer.

11. The method according to claim 10, wherein the frame layer is formed of a positive photosensitive resin.

12. The method according to claim 10, wherein the lens layer-forming material is a silicone oil.

13. The method according to claim 10, wherein the lens layer-forming material is an aqueous solution containing polyvinyl alcohol.

14. The method according to claim 1, wherein the step (b) includes:

forming a positive photosensitive resin layer on the negative photosensitive resin layer; and exposing the positive photosensitive resin layer and removing the exposed part to form a recess in the positive photosensitive resin layer with the result that the positive photosensitive resin layer having the recess serves as a lens layer, the recess serving as a lens.

15. The method according to claim 1, wherein the step (b) includes:

forming a water-repellent pattern on the negative photosensitive resin layer; and applying a liquid containing a lens layer-forming material onto the negative photosensitive resin layer having the water-repellent pattern to form the lens layer-forming material into the lens layer.

16. The method according to claim 15, the water-repellent pattern contains perfluoropolyether.

* * * * *